(12) United States Patent
Yashima

(10) Patent No.: US 9,659,747 B2
(45) Date of Patent: May 23, 2017

(54) METHOD OF GENERATING WRITE DATA FOR ENERGY BEAM WRITING APPARATUS, METHOD OF WRITING WITH ENERGY BEAM, AND ENERGY BEAM WRITING APPARATUS

(71) Applicant: NuFlare Technology, Inc., Yokohama-shi (JP)

(72) Inventor: Jun Yashima, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 14/942,312

(22) Filed: Nov. 16, 2015

(65) Prior Publication Data
US 2016/0211118 A1    Jul. 21, 2016

(30) Foreign Application Priority Data
Jan. 21, 2015 (JP) ................................. 2015-009641

(51) Int. Cl.
*H01J 37/302* (2006.01)
*H01J 37/317* (2006.01)

(52) U.S. Cl.
CPC ...... *H01J 37/3026* (2013.01); *H01J 37/3174* (2013.01); *H01J 2237/30416* (2013.01); *H01J 2237/3175* (2013.01)

(58) Field of Classification Search
CPC ............ H01J 37/3026; H01J 37/3174; H01J 2237/30416; H01J 2237/31725

USPC ......................................................... 382/298
See application file for complete search history.

(56) References Cited

U.S. PATENT DOCUMENTS

2002/0181796 A1* 12/2002 Yoshizawa .......... G06F 17/5081
382/256
2008/0184190 A1* 7/2008 Yashima ................ B82Y 10/00
716/53
2012/0126145 A1* 5/2012 Yashima ................ B82Y 10/00
250/492.3

FOREIGN PATENT DOCUMENTS

JP    2009-032904    2/2009
JP    2012-114105    6/2012

* cited by examiner

*Primary Examiner* — Wyatt Stoffa
*Assistant Examiner* — Eliza Osenbaugh-Stewar
(74) *Attorney, Agent, or Firm* — Oblon, McClelland, Maier & Neustadt, L.L.P.

(57) ABSTRACT

In one embodiment, a method is for generating write data for resizing a write pattern to be written with an energy beam. The method includes connecting vertices of the write pattern with a plurality of vectors, extracting a pair of collinear vectors pointing in opposite directions from the vectors, dividing the write pattern into a plurality of figures with a line passing between two adjacent ends of the extracted pair of vectors and extending in a direction orthogonal to the pair of vectors, and generating write data for each of the figures, the write data containing figure data and resizing information, the figure data indicating a shape, a size, and a position of the figure, the resizing information indicating resizing or non-resizing, resizing directions in the resizing, and an amount of resizing in each of the resizing directions.

15 Claims, 15 Drawing Sheets

FIG.4A
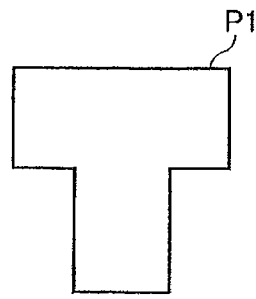

FIG.4B
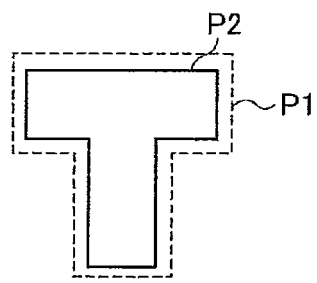

FIG.4C
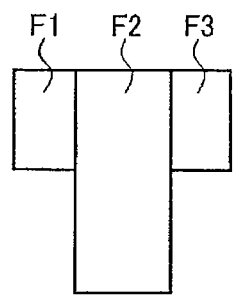

FIG.4D
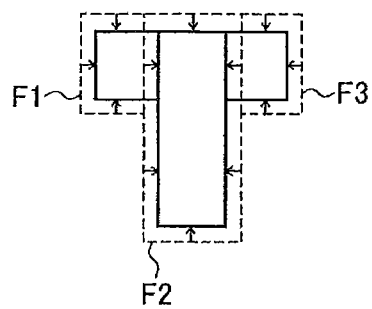

FIG.5A

| SHAPE,POSITION,AND SIZE OF FIGURE F1 | UPPER | | LOWER | | LEFT | | RIGHT | |
|---|---|---|---|---|---|---|---|---|
| | 01 | AMOUNT OF RESIZING | 01 | AMOUNT OF RESIZING | 01 | AMOUNT OF RESIZING | 10 | AMOUNT OF RESIZING |

FIG.5B

| SHAPE,POSITION,AND SIZE OF FIGURE F2 | UPPER | | LOWER | | LEFT | | RIGHT | |
|---|---|---|---|---|---|---|---|---|
| | 01 | AMOUNT OF RESIZING | 01 | AMOUNT OF RESIZING | 01 | AMOUNT OF RESIZING | 01 | AMOUNT OF RESIZING |

FIG.5C

| SHAPE,POSITION,AND SIZE OF FIGURE F3 | UPPER | | LOWER | | LEFT | | RIGHT | |
|---|---|---|---|---|---|---|---|---|
| | 01 | AMOUNT OF RESIZING | 01 | AMOUNT OF RESIZING | 10 | AMOUNT OF RESIZING | 01 | AMOUNT OF RESIZING |

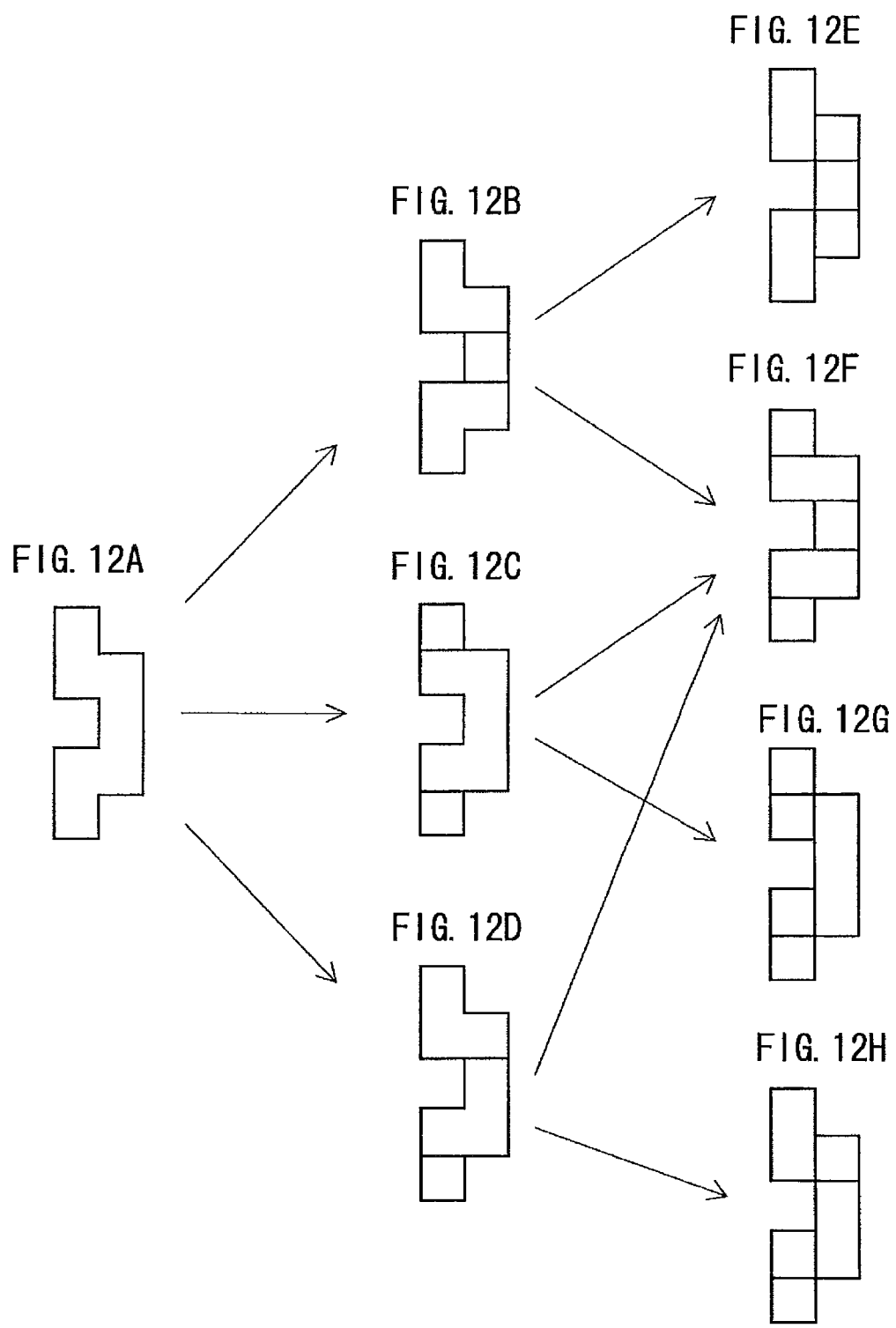

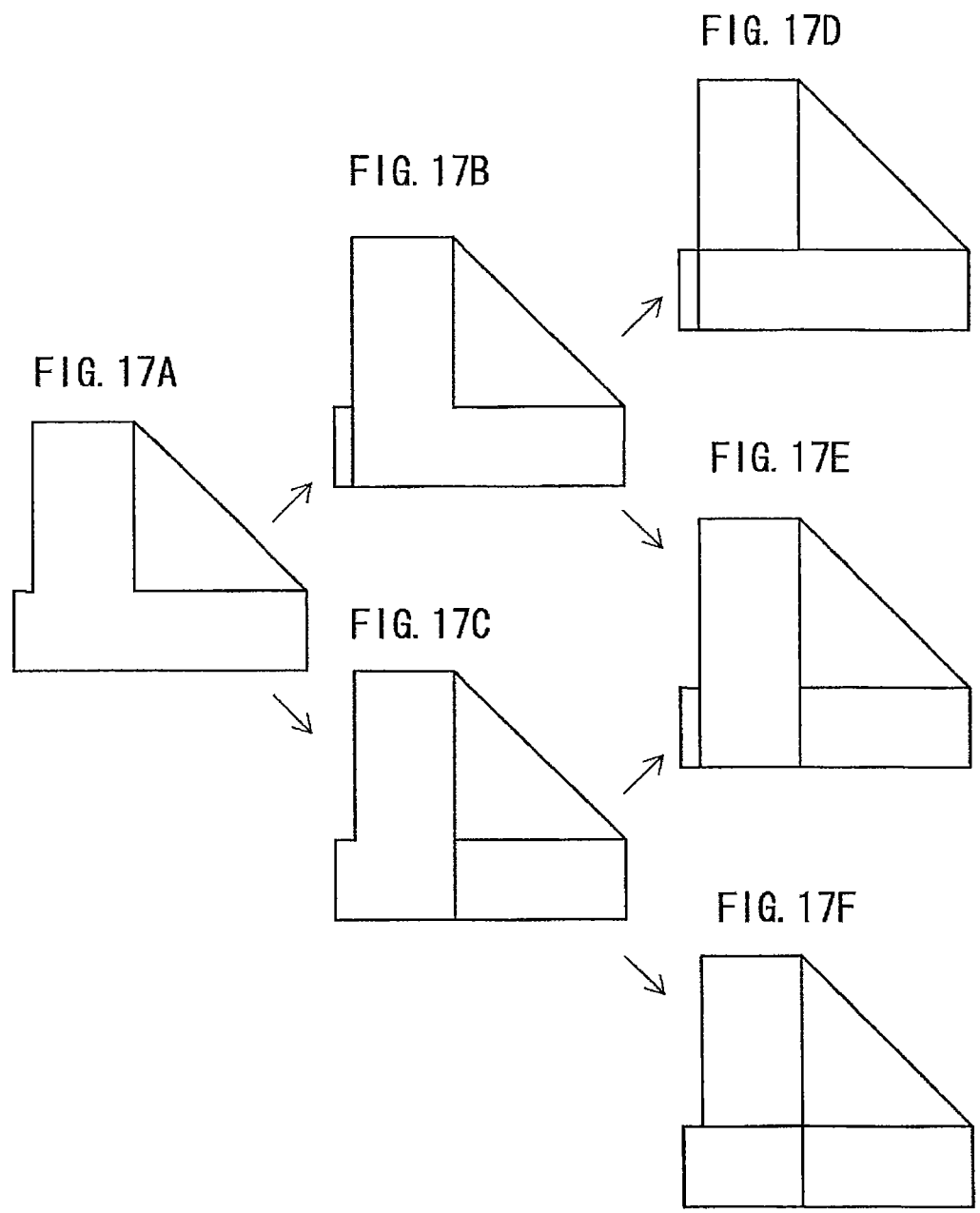

METHOD OF GENERATING WRITE DATA FOR ENERGY BEAM WRITING APPARATUS, METHOD OF WRITING WITH ENERGY BEAM, AND ENERGY BEAM WRITING APPARATUS

CROSS REFERENCE TO RELATED APPLICATION

This application is based upon and claims benefit of priority from the Japanese Patent Application No. 2015-9641, filed on Jan. 21, 2015, the entire contents of which are incorporated herein by reference.

FIELD

The present invention relates to a method of generating write data for energy beam writing apparatus, a method of writing with energy beam, and an energy beam writing apparatus.

BACKGROUND

With an increase in the density of LSI, the circuit line width of semiconductor devices has decreased through the years. To form a desired circuit pattern of semiconductor devices on a wafer, an original image pattern (i.e., a mask or, particularly, a reticle for use in steppers or scanners) with high precision formed on a quartz mask blank is transferred onto a wafer with its size reduced by using reduction projection light-exposure apparatus. The original image pattern with high precision is written by an electron beam writing apparatus, i.e., with a so-called electron beam lithography technique.

Patterns to be written have a wide variety of shapes. Typically, write data subjected to processing for division into figures that can be formed by a writing apparatus is input to the writing apparatus. A figure in contact with adjacent figures is accordingly defined as write data. In writing with an electron beam, the shape of a figure pattern to be written is resized in consideration of size fluctuations independent of an amount of irradiation with an electron beam, for example, size fluctuations caused by loading effects, and the resized figure is written. Resizing of figures is performed before write data is input to the writing apparatus. Alternatively, the resizing is performed in the writing apparatus (refer to Japanese Patent Application Publication Nos. 2009-32904 and 2012-114105, for example).

In the case where the resizing is performed in the writing apparatus, resizing information is added to write data to be input to the writing apparatus. The resizing information indicates resizing or non-resizing of each of figures formed by dividing a pattern and resizing directions in the resizing. Correct resizing information, however, may fail to be added depending on the shape of a pattern or the method of dividing the pattern.

BRIEF DESCRIPTION OF THE DRAWINGS

FIGS. 4A to 4D illustrate examples of resize processing.
FIGS. 5A to 5C illustrate examples of resizing information.
FIGS. 12A to 12H illustrate examples of figure division processing.
FIGS. 17A to 17F illustrate examples of figure division processing.

DETAILED DESCRIPTION

In one embodiment, a method is for generating write data for resizing a write pattern to be written with an energy beam. The method includes connecting vertices of the write pattern with a plurality of vectors, extracting a pair of collinear vectors pointing in opposite directions from the vectors, dividing the write pattern into a plurality of figures with a line passing between two adjacent ends of the extracted pair of vectors and extending in a direction orthogonal to the pair of vectors, and generating write data for each of the figures, the write data containing figure data and resizing information, the figure data indicating a shape, a size, and a position of the figure, the resizing information indicating resizing or non-resizing, resizing directions in the resizing, and an amount of resizing in each of the resizing directions.

Embodiments of the present invention will be described hereinafter with reference to the drawings. Here, a configuration using an electron beam as an example of energy beams will be described. The energy beams are, however, not limited to electron beams and may be charged particle beams such as ion beams or laser beams. A variable shaped beam type writing apparatus as an example of an energy beam writing apparatus will be described.

First Embodiment

Figure 1:
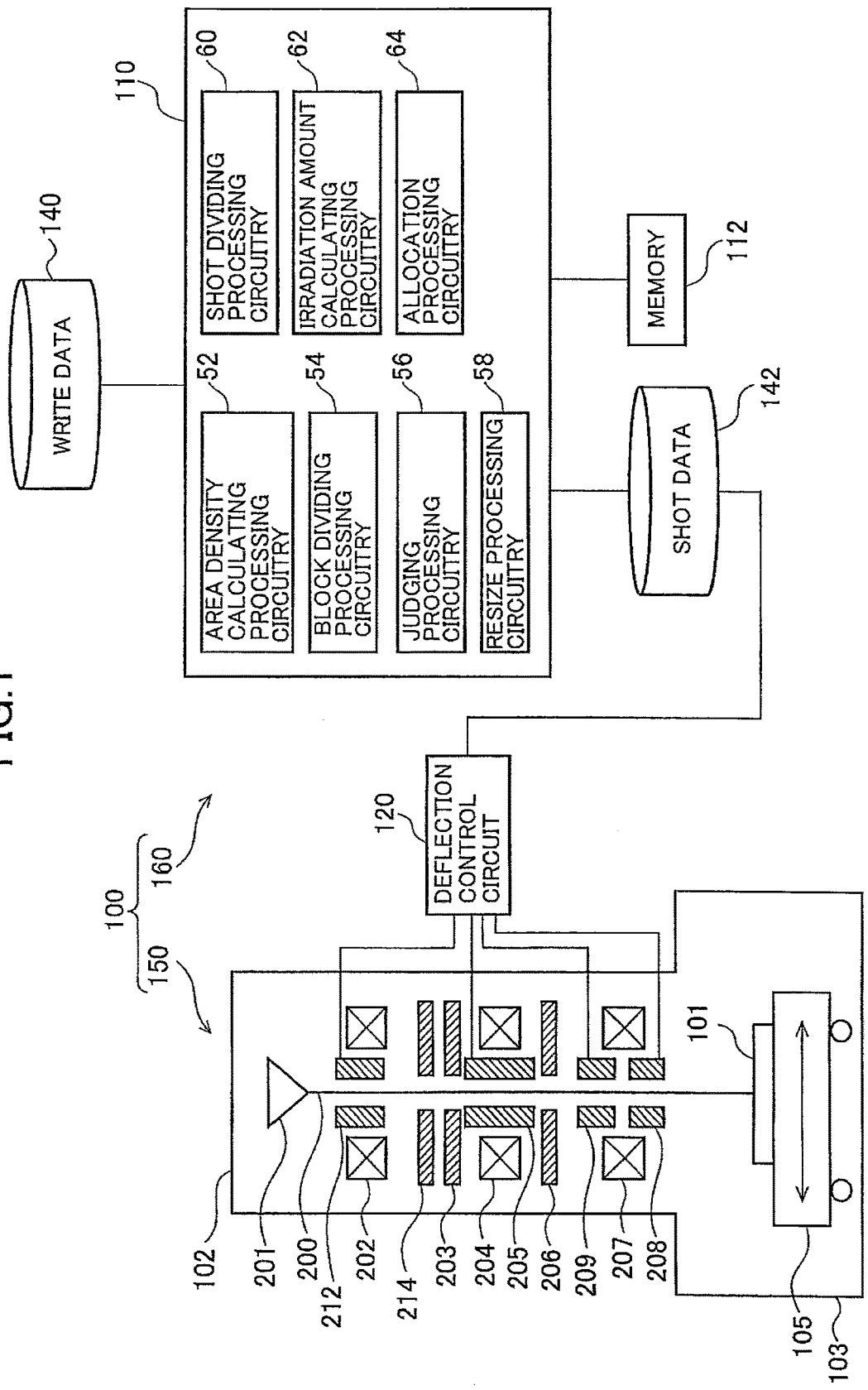
FIG. 1 schematically illustrates a writing apparatus according to a first embodiment of the present invention.

FIG. 1 schematically illustrates a writing apparatus according to the first embodiment of the present invention. As illustrated in FIG. 1, the writing apparatus 100 includes a writing mechanism 150 and a control processing circuitry 160. The writing apparatus 100 is an example of a charged particle beam writing apparatuses. Especially, the writing apparatus 100 is an example of variable shaped beam type writing apparatuses. The writing mechanism 150 includes an electron beam lens barrel 102 and a writing chamber 103. The electron beam lens barrel 102 accommodates an electron gun (an energy source) 201, a condensing lens 202, a blanking deflector (blanker) 212, a blanking aperture 214, a first shaping aperture 203, a projection lens 204, a deflector 205, a second shaping aperture 206, an objective lens 207, a main deflector 208, and a sub-deflector 209. The writing chamber 103 accommodates an XY stage 105 movable in the x-y direction. A sub-sub-deflector may be provided under the main deflector 208 to construct a three stage deflector. A substrate 101 to be drawn on which a resist is applied is placed on the substrate 101. The substrate 101 is a silicon wafer or an exposure mask used for producing semiconductor devices. This mask includes, for example, mask blanks on which any pattern is not formed.

The control processing circuitry 160 includes a control calculator 110, a memory 112, a deflection control circuit 120, memory devices 140 and 142 such as disk devices. The deflection control circuit 120 is connected to each deflector.

The control calculator 110 includes an area density calculating processing circuitry 52, a block dividing processing circuitry 54, a judging processing circuitry 56, a resize processing circuitry 58, a shot dividing processing circuitry 60, an irradiation amount calculating processing circuitry 62, and an allocation processing circuitry 64. Input data required for the control calculator 110 and arithmetic results are stored in the memory 112 every time. At least part of the control calculator 110 may be implemented in either hardware such as electric circuits or software. When implemented in software, a program that realizes at least part of functions of the control calculator 110 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The resize processing to figures to be drawn is performed in the writing apparatus based on resizing information described below. It is possible to correct dimensional fluctuations of figure patterns by performing the resize processing. This is preferable to correct dimensional fluctuations caused by phenomenon not attributable to dosage such as a loading effect, a micro loading effect, or a flare effect. Since the resize processing can be performed in the writing apparatus, the resize processing does not need to be performed in advance on the user side.

Figure 2:
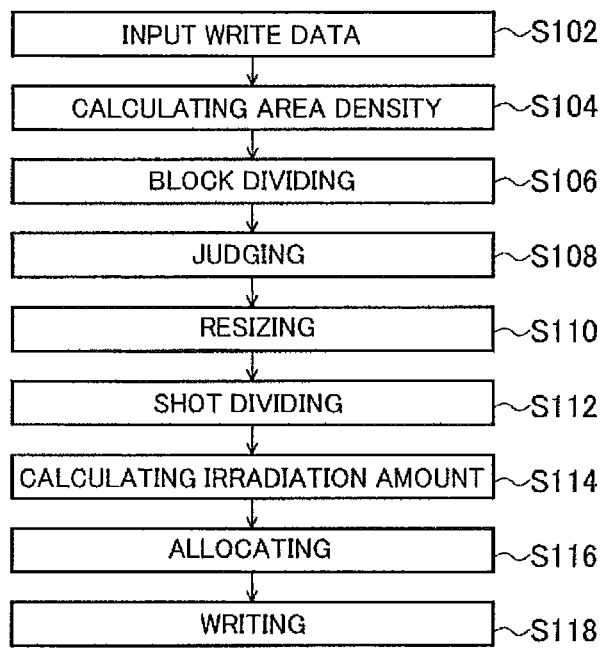
FIG. 2 is a flowchart describing a writing method according to the first embodiment.

FIG. 2 is a flowchart describing a writing method. This writing method includes a write data input step (S102), an area density calculating step (S104), a block dividing step (S106), a judging step (S108), a resize processing step (S110), a shot dividing step (S112), an irradiation amount calculating step (S114), an allocating step (S116), and a writing step (S118). The allocating step (S116) may be performed before the shot dividing step (S112).

Figure 3:
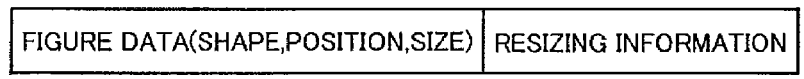
FIG. 3 schematically illustrates a format of write data.

FIG. 3 schematically illustrates a format of write data. As illustrated in FIG. 3, the write data input to the writing apparatus 100 from the outside includes figure data showing a position, a shape, and a size of each figure and the resizing information. The write data including the resizing information is input from the outside of the writing apparatus 100 and stored in the memory device 140.

As regards a rectangular figure, for example, resizing information contains data indicating resizing or non-resizing of top, bottom, right, and left sides of the figure, data indicating resizing directions in the resizing, and data indicating an amount of resizing (amount of correction) in each of the resizing directions.

Resizing information will now be described with reference to FIGS. 4A to 4D and FIGS. 5A to 5C. FIG. 4A illustrates a T-shaped pattern P1 as an exemplary write pattern. Reducing the size of the pattern P1 to resize the pattern P1 to a pattern P2, as illustrated in FIG. 4B, will be described.

The pattern P1 is divided into figures that can be formed by the writing apparatus. Write data is generated for each of the figures. For example, as illustrated in FIG. 4C, the pattern P1 is divided into three rectangular figures F1, F2, and F3 next to and in contact with each other. The figure F2 located centrally is longer in longitudinal dimension than the figures F1 and F3 on the right and left sides of the figure F2.

The figures F1, F2, and F3 are resized as illustrated in FIG. 4D, so that the pattern P2 can be represented. A resizing direction in which the size is reduced will be referred to as a "positive direction" and a resizing direction in which the size is increased will be referred to as a "negative direction" in the following description. The top side of the figure F1 is resized in the positive direction, the bottom side thereof is resized in the positive direction, the left side thereof is resized in the positive direction, and the right side thereof is resized in the negative direction. The top side of the figure F2 is resized in the positive direction, the bottom side thereof is resized in the positive direction, the left side thereof is resized in the positive direction, and the right side thereof is resized in the positive direction. The top side of the figure F3 is resized in the positive direction, the bottom side thereof is resized in the positive direction, the left side thereof is resized in the negative direction, and the right side thereof is resized in the positive direction.

The left side of the figure F2 is resized in the positive direction and the right side of the figure F1 is accordingly resized in the negative direction such that the position of the right side of the figure F1 is shifted in the negative direction, thus maintaining connection of the figures F2 and F1. In addition, the right side of the figure F2 is resized in the positive direction and the left side of the figure F3 is accordingly resized in the negative direction such that the position of the left side of the figure F3 is shifted in the negative direction, thus maintaining connection of the figures F2 and F3.

As illustrated in FIGS. 5A, 5B, and 5C, resizing information items about the figures F1, F2, and F3 each contain data indicating the resizing direction for each of the top, bottom, right, and left sides and data (simply represented as "resizing amount" in FIGS. 5A, 5B, and 5C) for calculating an amount of resizing of each of the top, bottom, right, and left sides. The data indicating the resizing direction in the resizing information has a two-bit value. A value "01" indicates the positive direction, a value "10" indicates the negative direction, and a value "00" indicates non-resizing.

As described above, resizing information about a figure contains a two-bit value indicating resizing or non-resizing of each of sides of the figure and the resizing direction. In addition, the resizing information contains data for calculating a resizing amount (correction amount) in the resizing direction for each of the sides of the figure.

Figure 6A:
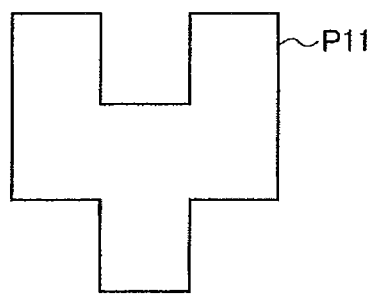
FIGS. 6A and 6B illustrate examples of resize processing.
Figure 6B:
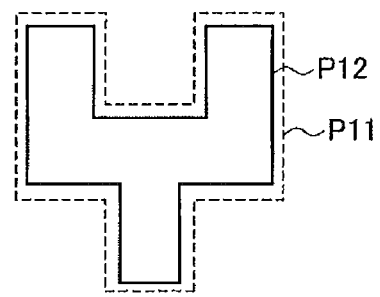

FIG. 6A shows a pattern P11 which is another example of the pattern to be written. A resize processing in which a dimension of the pattern P11 is reduced to change the pattern P11 to the pattern P12 shown in FIG. 6B will be described.

Figure 7A:
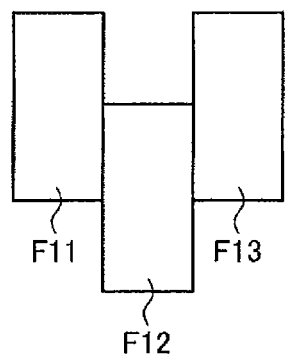
FIGS. 7A to 7E illustrate figure division processing according to comparative examples.

If the pattern P11 is divided into three rectangular figures F11, F12, and F13 by setting division lines in a vertical direction as shown in FIG. 7A, resizing information which represents the pattern P12 cannot be added.

Figure 7B:
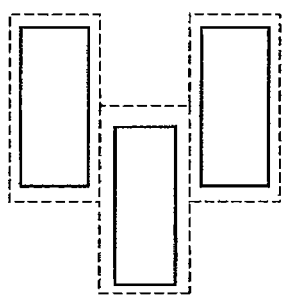

For example, as shown in FIG. 7B, if the upper, lower, right and left sides of figures F11, F12 and F13 are resized in the positive direction, a connection between the figures cannot be maintained.

Figure 7C:
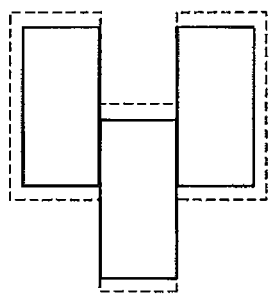
Figure 7D:
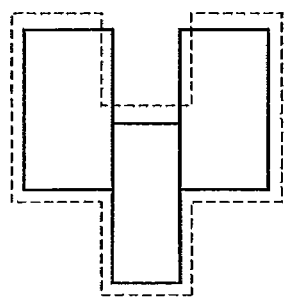
Figure 7E:
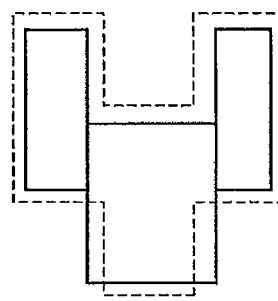

To maintain the connection between the figures, a resize processing as shown in FIG. 7C, 7D or 7E is performed. However, in FIG. 7C, the right side of the left figure, the left and right sides of the central figure, and the left side of the right figure are not resized in the positive direction. In FIG. 7D, the right side of the left figure and left side of the right figure are resized in the negative direction by as much as a quantity of resizing the left and right sides of the central figure in the positive direction. Thus, the pattern 12 cannot be represented. In FIG. 7E, the left and right sides of the central figure are resized in the negative direction by as much as a quantity of resizing the right side of the left figure and left side of the right figure in the positive direction. Thus, the pattern 12 cannot be represented.

If the writing data to which the resize information shown in FIGS. 7B to 7E is added is input to the writing apparatus 100, the resize processing cannot be performed with high accuracy, and the precision of drawing patterns on the substrate 101 is decreased. In this embodiment, the writing data to which highly precise resizing information is added is created to perform the resize processing with high accuracy.

Figure 8:
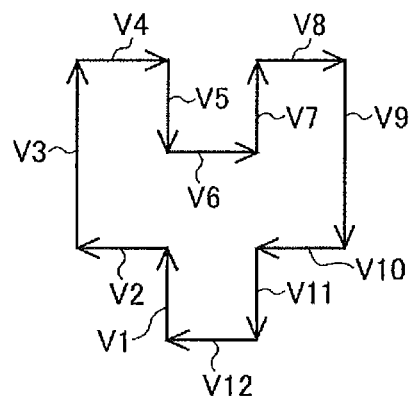
FIG. 8 illustrates vectors disposed to connect apexes of a pattern.

According to the present embodiment, to add correct resizing information, a write pattern is divided in the following manner. The vertices of the write pattern are connected by a plurality of vectors such that the vectors define the outline of the write pattern. For example, the vertices of the pattern P11 of FIG. 6A are connected by vectors V1 to V12 as illustrated in FIG. 8. The vectors V1 to V12 define the outline of the pattern P11.

Collinear vectors pointing in opposite directions are then extracted. In FIG. 8, the vectors V1 and V5 and the vectors V7 and V11 are extracted.

Figures 9A, 9B, 9C, 9D, 9E, 9F:
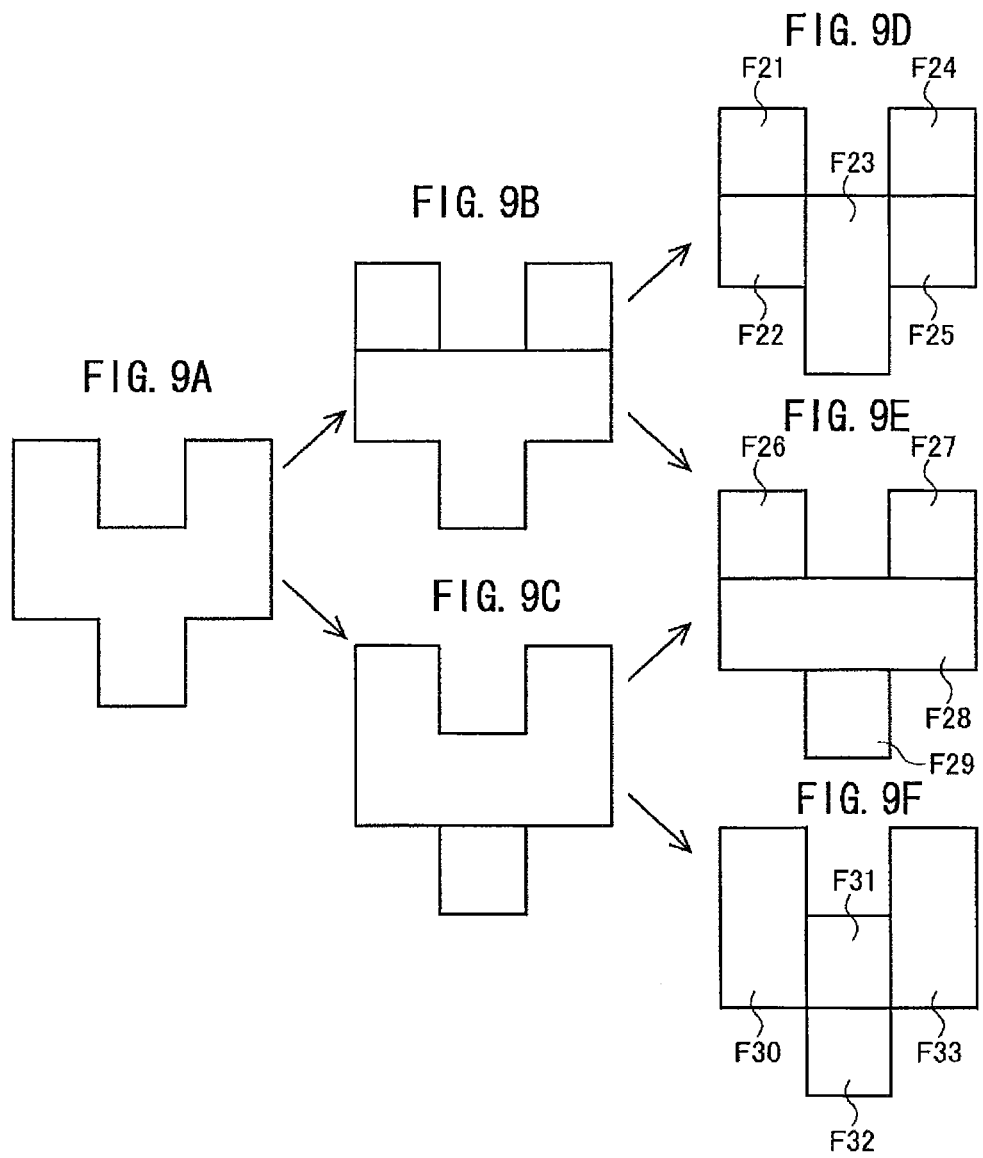
FIGS. 9A to 9F illustrate examples of figure division processing.

The write pattern is then divided by a line passing through one of opposed ends of the extracted collinear vectors and extending in a direction orthogonal to the vectors. The terminal points of the vectors V1 and V5 are opposed to each other. The initial points of the vectors V7 and V11 are opposed to each other. For example, as illustrated in FIG. 9B, the pattern P11 is divided by a line passing through the terminal point of the vector V5 and the initial point of the vector V7. Alternatively, as illustrated in FIG. 9C, the pattern P11 is divided by a line passing through the terminal point of the vector V1 and the initial point of the vector V11. FIG. 9A illustrates the pattern P11 before division.

The remaining figure may be divided in any way. For example, in the division of FIG. 9B, the remaining figure (lower part of the pattern P11) is divided as illustrated in FIG. 9D or 9E. In the division of FIG. 9C, the remaining figure (upper part of the pattern P11) is divided as illustrated in FIG. 9E or 9F.

Figure 10A:
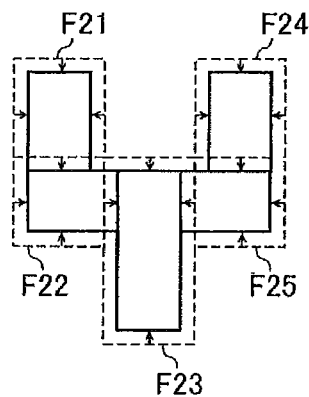
FIGS. 10A to 10C illustrate examples of resize processing.

When the pattern P11 is divided into five rectangular figures F21, F22, F23, F24 and F25 as shown in FIG. 9D, a resize processing as shown in FIG. 10A is performed. The upper, left and right sides of the figure F21 are resized in positive direction, and the lower side of the figure F21 is resized in negative direction. The upper, lower and left sides of the figure F22 are resized in positive direction, and the right side of the figure F22 is resized in negative direction. The upper, lower, left and right sides of the figure F23 are resized in positive direction. The upper, left and right sides of the figure F24 are resized in positive direction, and the lower side of the figure F24 is resized in negative direction. The upper, lower and right sides of the figure F25 are resized in positive direction, and the left side of the figure F25 is resized in negative direction.

By performing the resize processing as shown in FIG. 9D, it is possible to add the resizing information representing the pattern P12 while maintaining the connection between the resized figures.

Figure 10B:
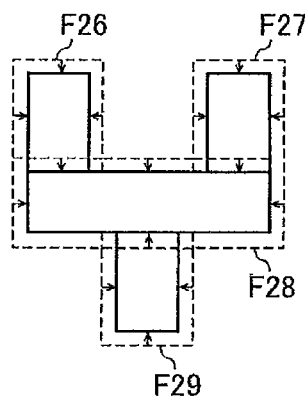

When the pattern P11 is divided into four rectangular figures F26, F27, F28 and F29 as shown in FIG. 9E, a resize processing as shown in FIG. 10B is performed. The upper, left and right sides of the figure F26 are resized in positive direction, and the lower side of the figure F26 is resized in negative direction. The upper, left and right sides of the figure F27 are resized in positive direction, and the lower side of the figure F27 is resized in negative direction. The upper, lower, left and right sides of the figure F28 are resized in positive direction. The lower, left and right sides of the figure F29 are resized in positive direction, and the upper side of the figure F29 is resized in negative direction.

By performing the resize processing as shown in FIG. 9E, it is possible to add the resizing information representing the pattern P12 while maintaining the connection between the resized figures.

Figure 10C:
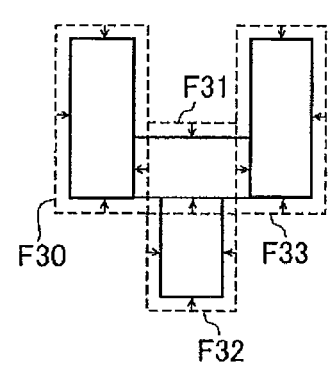

When the pattern P11 is divided into four rectangular figures F30, F31, F32 and F33 as shown in FIG. 9F, a resize processing as shown in FIG. 10C is performed. The upper, lower, left and right sides of the figure F30 are resized in positive direction. The upper and lower sides of the figure F31 are resized in positive direction, and the left and right sides of the figure F31 are resized in negative direction. The lower, left and right sides of the figure F32 are resized in positive direction, and the upper side of the figure F32 is resized in negative direction. The upper, lower, left and right sides of the figure F33 are resized in positive direction.

By performing the resize processing as shown in FIG. 9F, it is possible to add the resizing information representing the pattern P12 while maintaining the connection between the resized figures.

Among vectors connecting the vertices of a write pattern, a first vector and a second vector that are collinear and point in opposite directions are shifted in opposite directions when the write pattern is resized. If the write pattern is divided into figures and a side including the first vector overlaps a side including the second vector, correct resizing information items related to these sides cannot be added. For example, in the division illustrated in FIG. 7A, the right side of the figure F11 including the vector V5 overlaps the left side of the figure F12 including the vector V1. Disadvantageously, proper resizing information items about the right side of the figure F11 and the left side of the figure F12 cannot be added. Similarly, proper resizing information items about the right side of the figure F12 and the left side of the figure F13 cannot be added.

According to the present embodiment, the write pattern is divided by a line passing through one of opposed ends of the extracted collinear vectors and extending in a direction orthogonal to the vectors. Consequently, sides including the collinear vectors pointing in opposite directions do not overlap each other. For example, in FIG. 9D, the right side of the figure F21 including the vector V5 does not overlap the left side of the figure F23 including the vector V1. In FIG. 9E, the right side of the figure F26 including the vector V5 does not overlap the left side of the figure F29 including the vector V1. In FIG. 9F, the right side of the figure F30 including the vector V5 does not overlap the left side of the figure F32 including the vector V1. Consequently, proper resizing information can be added to each of the figures.

Figure 11A:
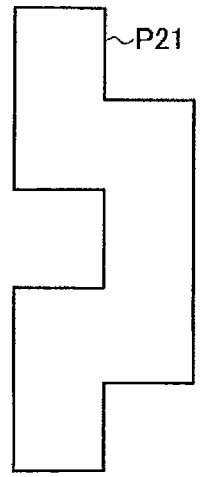
FIGS. 11A to 11C illustrate examples of resize processing.
Figure 11B:
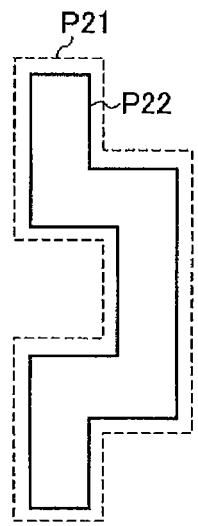
Figure 11C:
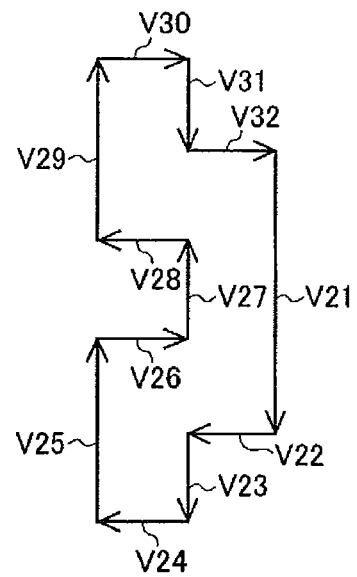

FIG. 11A illustrates a pattern P21 as another exemplary write pattern. Reducing the size of the pattern P21 to resize the pattern P21 to a pattern P22 as illustrated in FIG. 11B will now be described. The vertices of the pattern P21 are connected by vectors such that the vectors define the outline of the pattern P21. The outline of the pattern P21 is surrounded by vectors V21 to V32 as illustrated in FIG. 11C.

Collinear vectors pointing in opposite directions are then extracted. In FIG. 11C, the vectors V23 and V27 and the vectors V27 and V31 are extracted.

The write pattern is then divided by a line passing through one of opposed ends of the extracted collinear vectors and extending in a direction orthogonal to the vectors. The initial points of the vectors V23 and V27 are opposed to each other. The terminal points of the vectors V27 and V31 are opposed to each other.

For example, as illustrated in FIG. 12B, the pattern P21 is divided by a line passing through the initial point of the vector V27 and another line passing through the terminal point of the vector V27. Alternatively, as illustrated in FIG. 12C, the pattern P21 is divided by a line passing through the initial point of the vector V23 and another line passing through the terminal point of the vector V31. Alternatively, as illustrated in FIG. 12D, the pattern P21 is divided by a line passing through the initial point of the vector V23 and another line passing through the terminal point of the vector V27. FIG. 12A illustrates the pattern P21 before division.

The remaining figures may be divided in any way. In the division of FIG. 12B, the remaining figures are divided as illustrated in FIG. 12E or 12F. In the division of FIG. 12C, the remaining figures are divided as illustrated in FIG. 12F or 12G. In the division of FIG. 12D, the remaining figures are divided as illustrated in FIG. 12F or 12H.

Figure 13A:
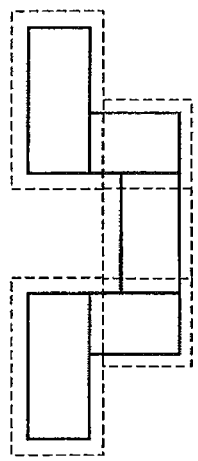
FIGS. 13A to 13D illustrate examples of resize processing.
Figure 13B:
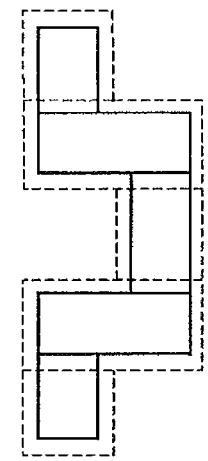
Figure 13C:
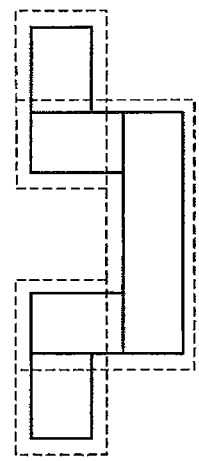
Figure 13D:
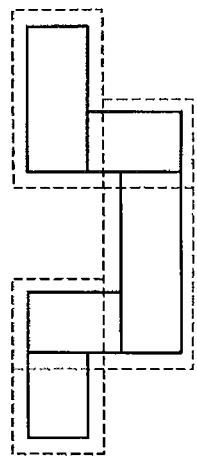

In the case where the pattern P21 is divided into five rectangular figures as illustrated in FIG. 12E, the figures are resized as illustrated in FIG. 13A, so that the pattern P22 can be represented. In the case where the pattern P21 is divided into five rectangular figures as illustrated in FIG. 12F, the figures are resized as illustrated in FIG. 13B, so that the pattern P22 can be represented. In the case where the pattern P21 is divided into five rectangular figures as illustrated in FIG. 12G, the figures are resized as illustrated in FIG. 13C, so that the pattern P22 can be represented. In the case where the pattern P21 is divided into five rectangular figures as illustrated in FIG. 12H, the figures are resized as illustrated in FIG. 13D, so that the pattern P22 can be represented.

In each of FIGS. 12E to 12H, after division of the write pattern P21, the side including the vector V23 does not overlap the side including the vector V27. In addition, the side including the vector V27 does not overlap the side including the vector V31. Consequently, proper resizing information can be added to each of the figures.

A write pattern is divided into figures. Write data about each figure contains data indicating the position, shape, and size of the figure and resizing information. The write data is generated outside the writing apparatus 100. For example, when a data conversion device converts layout data (for example, computer-aided design (CAD) data), serving as design data generated by a user, into write data that can be input to the writing apparatus 100, the data conversion device performs the above-described division into figures and adds resizing information to generate write data. In step S102 in FIG. 2, the generated write data is stored into the storage 140.

The area density calculating processing circuitry 52 divides a write area on the substrate 101 into mesh regions, and calculates the areal density of a pattern in each of mesh regions (step S104). A mesh size of, for example, approximately 1 mm to approximately 2 mm may be used.

The block dividing processing circuitry 54 divides the write area on the substrate 101 into block regions, serving as units subjected to data processing (step S106).

The judging processing circuitry 56 judges, on the basis of the write data, resizing or non-resizing, resizing directions, and amounts of resizing for each of the figures (step S108).

The resize processing circuitry 58 resizes the size of each of the figures in accordance with determination results (step S110).

The shot dividing processing circuitry 60 divides each figure into shot figure parts each having a size that can be formed by a single shot of an electron beam 200 (step S112).

The irradiation amount calculating processing circuitry 62 calculates the amount of irradiation with the electron beam 200 for each of the shot figure parts (step S114).

The allocation processing circuitry 64 allocates the shot figure parts to regions, each having a size in which deflection can be achieved by the sub-deflector 209, virtually arranged in a mesh pattern in the write area on the substrate 101 (step S116). Data (shot data) items for respective shots generated in the above-described manner are sequentially temporarily stored into the storage 142 in the order of generation.

The deflection control circuit 120 reads the shot data and outputs a deflection voltage corresponding to an amount of deflection necessary for each of the deflectors in accordance with the shot data. The writing mechanism 150 combines the shot figure parts to write a resized figure pattern (step S118).

As described above, the writing mechanism 150 writes the figure pattern on the substrate 101 on the basis of the resized figures with the electron beam. Specifically, the writing mechanism 150 operates as follows.

The blanking deflector 212 controls the electron beam 200 emitted from the electron gun (emitting unit) 201 in such a manner that the electron beam 200 passes through the blanking aperture 214 in a beam-ON mode and the whole of the electron beam 200 is deflected so as to be interrupted by the blanking aperture 214 in a beam-OFF mode. The electron beam passing through the blanking aperture 214 during transition from the beam-OFF mode to the beam-ON mode and then to the beam-OFF mode is an electron beam shot at one time.

The blanking deflector 212 controls the direction of the electron beam 200 to generate the beam-ON mode and the beam-OFF mode alternately. For example, a voltage is not applied to the blanking deflector 212 in the beam-ON mode, and the voltage is applied to the blanking deflector 212 in the beam-OFF mode. A dose of electron beam radiation per shot to the substrate 101 is controlled depending on the time of radiation of each shot.

The electron beam 200 passing through the blanking deflector 212 and the blanking aperture 214 is applied to the entire first shaping aperture 203 having a rectangular hole by the condensing lens 202. The electron beam 200 is first shaped into a rectangle.

The electron beam passing through the first shaping aperture 203 and corresponding to a first aperture image is projected onto the second shaping aperture 206 through the projection lens 204. The position of the first aperture image on the second shaping aperture 206 is controlled by the deflector 205, so that the electron beam can be varied in shape and size. Such beam shaping is performed for each shot. Generally, the beam is shaped in different shape and size for each shot.

The electron beam 200 passing through the second shaping aperture 206 and corresponding to a second aperture image is focused by the objective lens 207 and is deflected by the main deflector 208 and the sub-deflector 209. The resultant electron beam is applied to a desired position on the substrate 101 on the X-Y stage 105 which moves continuously. As described above, a plurality of shots of the electron beam 200 is deflected onto the substrate in turn by each deflector.

In the present embodiment, the vertices of a write pattern are connected by vectors, collinear vectors pointing in opposite directions are extracted, and the write pattern is divided by a line passing through one of opposed ends of the extracted vectors and extending in a direction orthogonal to the vectors. In this division of the write pattern, sides including the collinear vectors pointing in opposite directions do not overlap each other. Consequently, proper resizing information can be added to each of figures.

Adding such resizing information to write data to be input enables the writing apparatus to perform accurate resizing.

In this embodiment, the case where the write pattern is divided by a line passing through one of opposed ends of two extracted vectors has been described. The write pattern may be divided by a line passing through any point on a segment connecting the opposed ends and intersecting the segment at right angles. Specifically, the write pattern may be divided by a line passing between two adjacent ends of the two extracted vectors and extending in a direction orthogonal to the two vectors. Such division enables proper resizing information to be added to each of figures formed by the division.

Second Embodiment

Figure 14A:
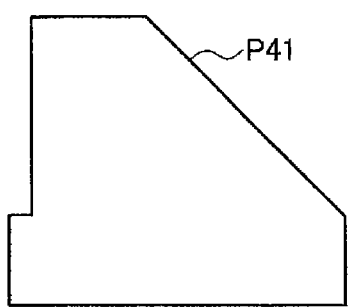
FIGS. 14A and 14B illustrate examples of resize processing.
Figure 14B:
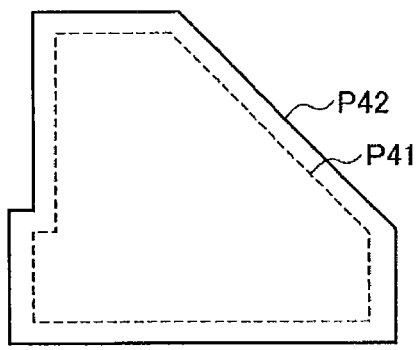

FIG. 14A illustrates a pattern P41 as an exemplary write pattern having an oblique side. Increasing the size of the pattern P41 to resize the pattern P41 to a pattern P42 as illustrated in FIG. 14B will be described.

Figure 15A:
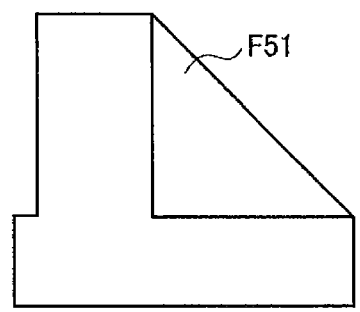
FIGS. 15A and 15B illustrate examples of resize processing.

In dividing a pattern having an oblique side, a triangle (right triangle) having the oblique side is extracted. Referring to FIG. 15A, a triangle F51 is extracted from the pattern P41.

Figure 15B:
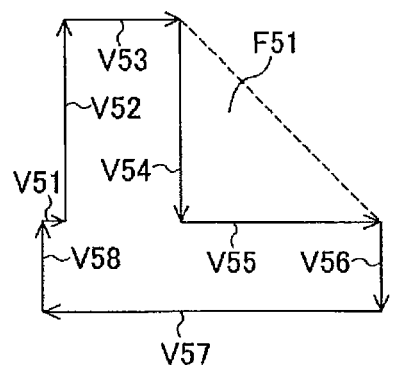

The vertices of the pattern from which the triangle is extracted are connected by vectors such that the vectors define the outline of the pattern. The outline of the pattern P41 from which the triangle F51 is extracted is surrounded by vectors V51 to V58 as illustrated in FIG. 15B.

Figure 16A:
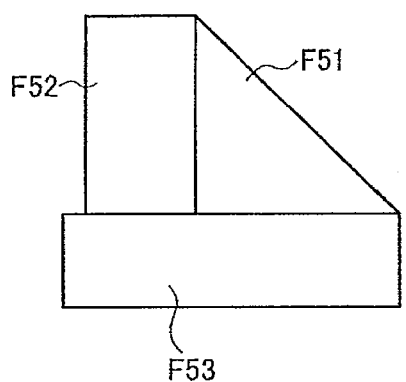
FIGS. 16A to 16C illustrate resize processing according to comparative examples.

These vectors do not include collinear vectors pointing in opposite directions. The pattern P41 except the triangle F51 is accordingly divided into rectangular figures F52 and F53 as illustrated in FIG. 16A.

In this division, resizing information cannot be added so that the pattern P42 is represented. For example, if resizing is performed such that the right vertex of a triangle F51' coincides with the upper right vertex of a rectangle F53' as illustrated in FIG. 16B, resizing information cannot be added to a hatched portion in FIG. 16B.

Figure 16B:
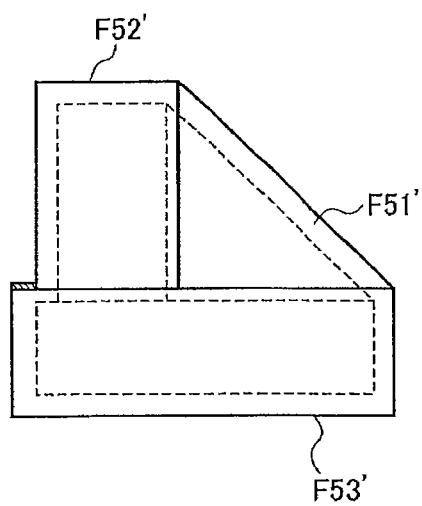

When the upper side of the rectangle F53 is resized so as not to produce the hatched portion in FIG. 16B, the right vertex of a triangle F51" does not coincide with the upper right vertex of a rectangle F53", thus forming a step.

Figure 16C:
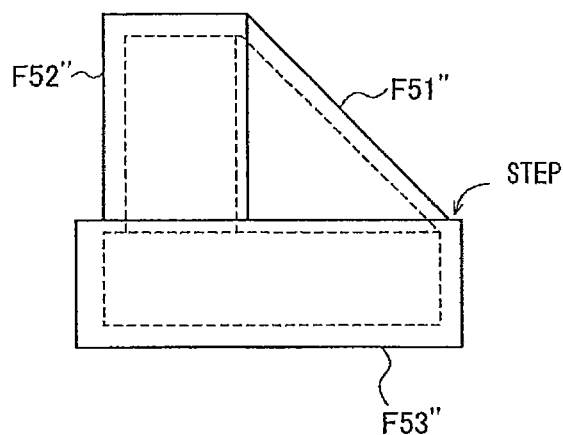

The reason why correct resizing information cannot be added as in the cases of FIGS. 16B and 16C is that the amount of resizing of a side corresponding to the vector V51 differs from the amount of resizing of a side corresponding to the vector V55 in FIG. 15B.

The side corresponding to the vector V55 is a side of the triangle F51. The amount of resizing of this side differs from that of the side corresponding to the vector V51 included in the outline of the pattern P41. Accordingly, proper resizing information cannot be added to the rectangle F53 having the upper side including these vectors.

According to the present embodiment, after the vertices of a write pattern from which a triangle is extracted are connected by vectors such that the vectors define the outline of the pattern, collinear vectors pointing in opposite directions are extracted. Collinear vectors, at least one of which corresponds to one side of the triangle, pointing in the same direction are then extracted. The write pattern is divided by a line passing through one of opposed ends of the extracted collinear vectors and extending in a direction orthogonal to the vectors. The term "triangles" as used herein may include a triangle having arbitrary angle as well as an isosceles right triangle. The amount of resizing varies depending on the type (angle) of triangle. If collinear vectors pointing in the same direction in a write pattern are related to different amounts of resizing, the write pattern has to be divided by a line passing through one of opposed ends of the collinear vectors pointing in the same direction and extending in a direction orthogonal to the vectors.

For example, in the case of FIG. 15B, the vectors V51 and V55 are collinear and point in the same direction. The vector V55 corresponds to one side of the triangle F51. The vectors V51 and V55 are therefore extracted. The terminal point of the vector V51 is opposed to the initial point of the vector V55.

For example, as illustrated in FIG. 17B, the pattern P41 is divided by a line passing through the terminal point of the vector V51. Alternatively, as illustrated in FIG. 17C, the pattern P41 is divided by a line passing through the initial point of the vector V55.

The remaining figure may be divided in any way. In the division of FIG. 17B, the remaining figure is divided as illustrated in FIG. 17D or 17E. In the division of FIG. 17C, the remaining figure is divided as illustrated in FIG. 17E or 17F.

Figure 18A:
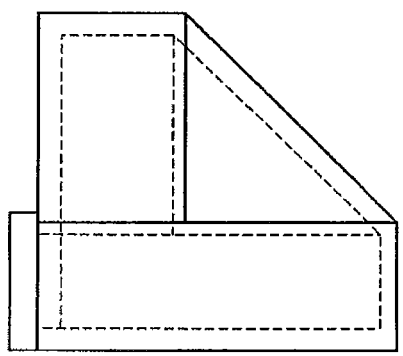
FIGS. 18A to 18C illustrate examples of resize processing.
Figure 18B:
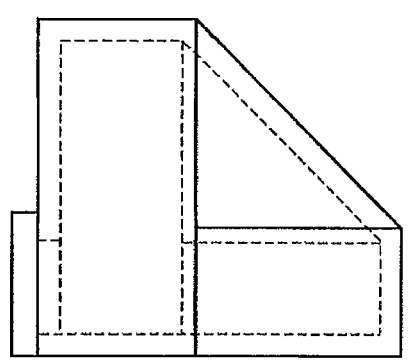
Figure 18C:
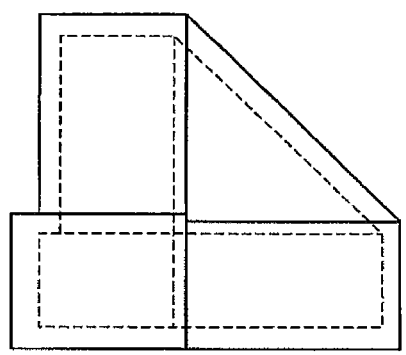

In the case where the pattern P41 is divided into three rectangles and one triangle as illustrated in FIG. 17D, the figures are resized as illustrated in FIG. 18A, so that the pattern P42 can be represented. In the case where the pattern P41 is divided into three rectangles and one triangle as illustrated in FIG. 17E, the figures are resized as illustrated in FIG. 18B, so that the pattern P42 can be represented. In the case where the pattern P41 is divided into three rectangles and one triangle as illustrated in FIG. 17F, the figures are resized as illustrated in FIG. 18C, so that the pattern P42 can be represented.

In each of FIGS. 17D to 17F, the side including the vector V51 does not overlap the side including the vector V55. Consequently, proper resizing information can be added to each figure.

Figure 19A:
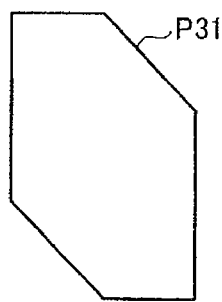
FIGS. 19A to 19D illustrate examples of resize processing.
Figure 19B:
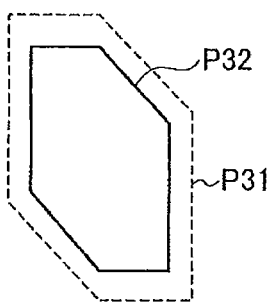

A method of dividing another write pattern having oblique sides will now be described. FIG. 19A illustrates a pattern P31 as an exemplary write pattern having oblique sides. Reducing the size of the pattern P31 to resize the pattern P31 to a pattern P32 as illustrated in FIG. 19B will be described.

Figure 19C:
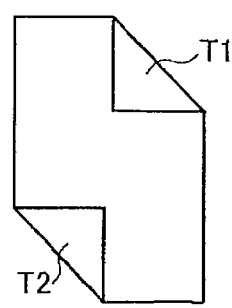

As illustrated in FIG. 19C, triangles T1 and T2 are extracted from the pattern P31.

Figure 19D:
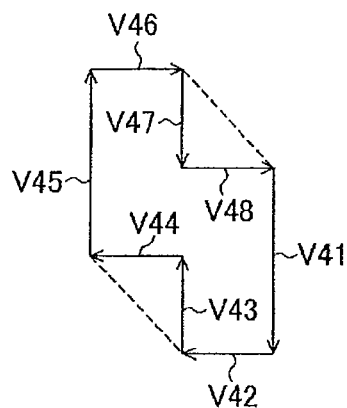

The vertices of the pattern from which the triangles are extracted are then connected by vectors such that the vectors define the outline of the pattern. The outline of the pattern P31 from which the triangles T1 and T2 are extracted is surrounded by vectors V41 to V48 as illustrated in FIG. 19D.

Collinear vectors pointing in opposite directions are then extracted. In FIG. 19D, the vectors V43 and V47 are extracted. In this case, only the vectors V43 and V47 are collinear vectors.

The write pattern is then divided by a line passing through one of opposed ends of the extracted collinear vectors and extending in a direction orthogonal to the vectors. The terminal points of the vectors V43 and V47 are opposed to each other. The remaining figure is divided in any way. Thus, the pattern P31 is divided as illustrated in FIG. 20A, 20B, or 20C.

Figure 20A:
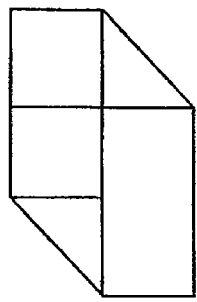
FIGS. 20A to 20C illustrate examples of figure division processing.
Figure 20B:
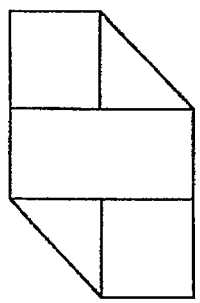
Figure 20C:
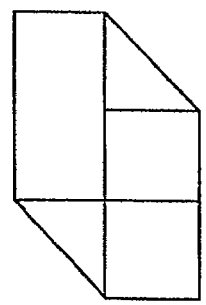
Figure 21A:
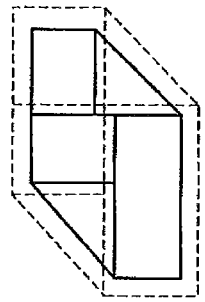
FIGS. 21A to 21C illustrate examples of resize processing.
Figure 21B:
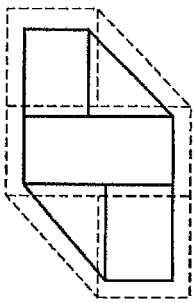
Figure 21C:
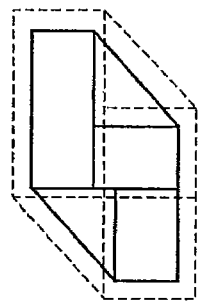

In the case where the pattern P31 is divided into three rectangles and two triangles as illustrated in FIG. 20A, the figures are resized as illustrated in FIG. 21A, so that the pattern P32 can be represented. In the case where the pattern P31 is divided into three rectangles and two triangles as illustrated in FIG. 20B, the figures are resized as illustrated in FIG. 21B, so that the pattern P32 can be represented. In the case where the pattern P31 is divided into three rectangles and two triangles as illustrated in FIG. 20C, the figures are resized as illustrated in FIG. 21C, so that the pattern P32 can be represented.

In the present embodiment, the vertices of a write pattern from which a triangle is extracted are connected by vectors such that the vectors define the outline of the pattern, collinear vectors, at least one of which corresponds to one side of the triangle, pointing in the same direction are extracted, and the write pattern is divided by a line passing through one of opposed ends of the extracted vectors and extending in a direction orthogonal to the vectors. Proper resizing information can be added to each of figures formed by dividing the pattern as described above. Adding the proper resizing information to write data enables the writing apparatus to perform accurate resizing.

Third Embodiment

Figure 22A:
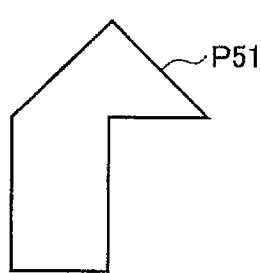
FIGS. 22A to 22C illustrate examples of resize processing.
Figure 22B:
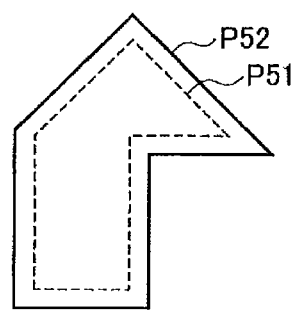
Figure 22C:
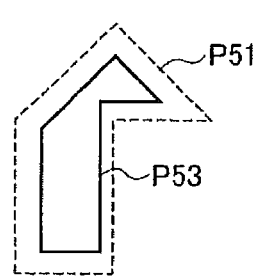

FIG. 22A illustrates a pattern P51 as an exemplary write pattern having oblique sides. Increasing the size of the pattern P51 to resize the pattern P51 to a pattern P52 as illustrated in FIG. 22B and reducing the size of the pattern P51 to resize the pattern P51 to a pattern P53 as illustrated in FIG. 22C will be described.

Figure 23A:
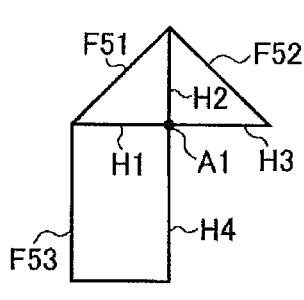
FIGS. 23A to 23C illustrate examples of resize processing.

Triangles (right triangles) having the oblique sides are extracted. Referring to FIG. 23A, triangular figures F51 and F52 are extracted from the pattern P51. The pattern P51 is divided into the two triangular figures F51 and F52 and one rectangular figure F53.

In this pattern, four sides H1 to H4 are connected at one end to a vertex A1 such that the sides H1 to H4 are spaced 90° apart about the vertex A1. Specifically, the sides H1 and H3 are connected at one end to the vertex A1 such that the sides H1 and H3 are collinear, and the sides H2 and H4 are connected at one end to the vertex A1 such that the sides H2 and H4 are collinear. A segment constituted by the sides H1 and H3 is orthogonal to a segment constituted by the sides H2 and H4.

The side H1 corresponds to one side of the rectangle F53 and the side H3 corresponds to one side of the triangle F52. The amounts of resizing of these sides are different. Similarly, the side H2 corresponds to one side of the triangle F51 (F52) and the side H4 corresponds to one side of the rectangle F53. The amounts of resizing of these sides are different. In the case where four sides are connected at one end such that the four sides meet at right angles and the amounts of resizing of the two sides that are collinear on opposite sides of a connection point (vertex A1) are different as described above, if figures formed by division are merely resized, resized figures could not be represented. It is therefore necessary to add a figure in resizing.

Figure 23B:
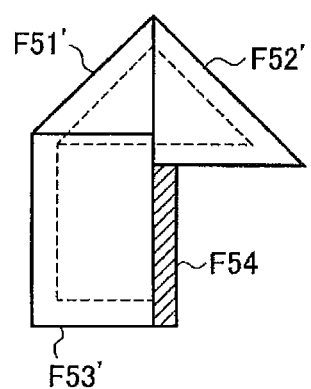

For example, when the size of the pattern P51 is increased to represent the pattern P52 as illustrated in FIG. 22B, the figures F51, F52, and F53 are resized to figures F51', F52', and F53' as illustrated in FIG. 23B. Furthermore, it is necessary to add a rectangular figure F54 to the right of the figure F53'.

Figure 23C:
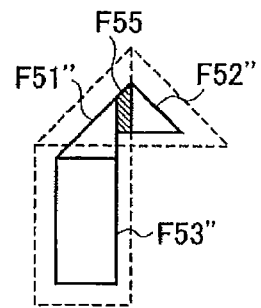

When the size of the pattern P51 is reduced to represent the pattern P53 as illustrated in FIG. 22C, the figures F51, F52, and F53 are resized to figures F51", F52", and F53" as illustrated in FIG. 23C. Furthermore, it is necessary to add a trapezoidal figure F55 between the figures F51" and F52".

In the above-described case, write data about the added figure contains figure data indicating the position, shape, and size of the added figure and resizing information. The write pattern P51, however, does not include a region corresponding to the added figure F54 or F55. In the figure data about the added figure, the width (dimension in the X direction or the Y direction) of the figure is represented by zero.

For example, in the write data about the figure F54, the position corresponding to the side H4 of the figure F53 is set. The shape is set to a rectangle. The dimension in the Y direction is set to a length identical to the length of the side H4 and the dimension in the X direction is set to zero. In the resizing information, the left side is set to non-resizing, the direction of resizing of the top side is set to "positive", and the direction of resizing of the bottom and right sides is set to "negative". In addition, the amount of resizing of each of the sides is set.

In the write data about the figure F55, the position corresponding to the side H2 of the figure F52 is set. The shape is set to a trapezoid. The dimension in the Y direction is set to a length identical to the length of the side H2 and the dimension in the X direction is set to zero. In the resizing information, the right side is set to non-resizing, the direction of resizing of the top and bottom sides is set to "positive", and the direction of resizing of the left side is set to "negative". In addition, the amount of resizing of each of the sides is set.

As described above, according to the present embodiment, whether first to fourth sides, or four sides are connected at one end to one vertex such that the four sides meet at right angles at the vertex and the amounts of resizing of the two sides which are collinear on opposite sides of the vertex are different is determined. When the amounts of resizing of the first and third sides which are collinear on opposite sides of the vertex are different and the amounts of resizing of the second and fourth sides which are collinear on opposite sides of the vertex are different, a figure is added in resizing such that the figure is in contact with any of the first to fourth sides. Consequently, proper resizing information can be added to write data so that the writing apparatus performs accurate resizing.

Although figure data about an additional figure is added in write data in the present embodiment, the additional figure may be added in resizing.

Fourth Embodiment

Figure 24A:
FIGS. 24A and 24B illustrate examples of figure division processing.
Figure 24B:
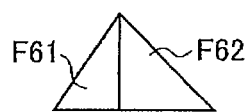

FIG. 24A illustrates a pattern P61 as an exemplary triangular write pattern having an angle (arbitrary angle) other than an integer multiple of 45°. To increase the size of the pattern P61 in order to resize the pattern P61, a perpendicular is dropped from one vertex to the side opposite to the vertex to divide the pattern P61 into two right triangular figures F61 and F62 as illustrated in FIG. 24B.

Figure 25A:
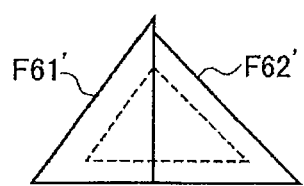
FIGS. 25A and 25B illustrate examples of resize processing.

As illustrated in FIG. 25A, the figures F61 and F62 are resized to figures F61' and F62', respectively.

Figure 25B:
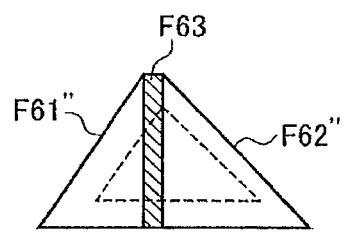

Alternatively, as illustrated in FIG. 25B, the figures F61 and F62 are resized to figures F61" and F62", respectively. Furthermore, a rectangular figure F63 is added between the figures F61" and F62". The width (dimension in the X direction) of the added figure F63 is set to zero in write data about the added figure F63 in a manner similar to the above-described third embodiment.

The writing apparatus can accurately resize a triangular write pattern having arbitrary angle by adding a figure and adding proper resizing information to write data.

Although figure data about an additional figure is added in write data in the present embodiment, the additional figure may be added in resizing.

Fifth Embodiment

Figure 26A:
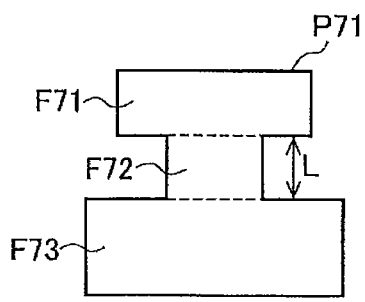
FIGS. 26A to 26D illustrate examples of resize processing.

FIG. 26A illustrates a dodecagonal pattern P71 including three rectangular parts connected to one another and having different sizes. Increasing the size of the pattern P71 to resize the pattern P71 will be described. When the vertices of the pattern P71 are connected by vectors such that the vectors define the outline of the pattern P71, the vectors do not include collinear vectors pointing in opposite directions. Since the pattern P71 can be divided in any way, the pattern P71 is divided into, for example, rectangular figures F71, F72, and F73.

The figure F72 is shorter in lateral dimension than the figures F71 and F73. The figure F71 is shorter in lateral dimension than the figure F73. The right and left sides of the figure F71 are located within the right and left sides of the figure F73. The right and left sides of the figure F72 are located within the right and left sides of the figure F71. The top and bottom sides of the figures F71, F72, and F73 are parallel to one another. Let L denote the height of the figure F72, namely, the distance between the bottom side of the figure F71 and the top side of the figure F73.

Figure 26B:
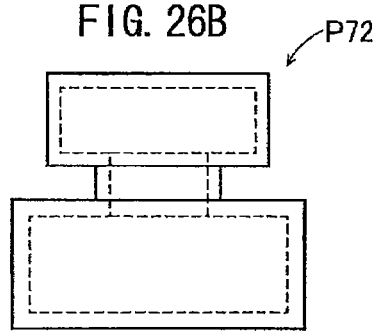
Figure 26C:
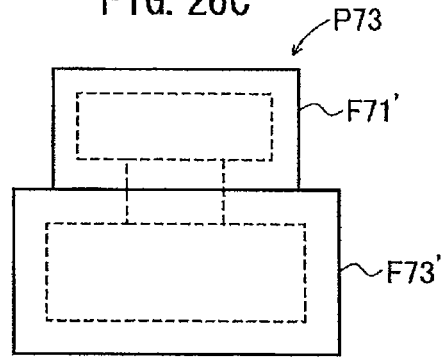

FIG. 26B illustrates a resized example of the pattern P71 obtained by increasing the size of the pattern P71. FIG. 26C illustrates another resized example of the pattern P71 obtained by further increasing the size of the pattern P71 such that the amount of resizing of the pattern P71 in its longitudinal direction is L/2. In FIG. 26C, the bottom side of a figure F71' obtained by increasing the size of the figure F71 is in contact with the top side of a figure F73' obtained by increasing the size of the figure F73.

Figure 26D:
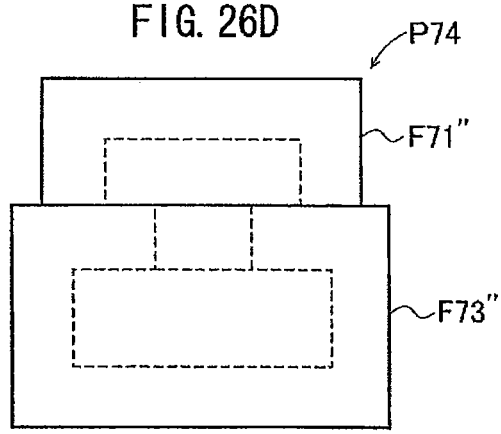

When the amount of resizing exceeds L/2, lower part of the figure F71' overlaps upper part of the figure F73'. In resizing of the figure F71, therefore, the figure F71 is resized such that part of the figure F71 resized in a direction toward the figure F73 (downward direction in FIG. 26A) by an amount exceeding L/2 is reversed in a direction (upward direction in FIG. 26A) opposite to the above direction. For example, when the amount of resizing is L, the amount of resizing of the bottom side of the figure F71" is zero as illustrated in FIG. 26D.

As described above, in the case where the rectangular figures F71 and F73 having different sizes are opposed to each other such that the figure F71 having a dimension shorter than that of the figure F73 is located within opposite ends of the figure F73 and the figure F73 having a dimension longer than that of the figure F71 is located outside opposite ends of the figure F71, when the figure F71 is resized in a first direction toward the figure F73 by an amount exceeding a threshold that is a half the distance between the figures, the figure F71 is resized such that part of the figure F71 corresponding to the exceeding amount is reversed in a second direction opposite to the first direction. Consequently, proper resizing information can be added to write data so that there is no overlap between the figures.

Figure 27A:
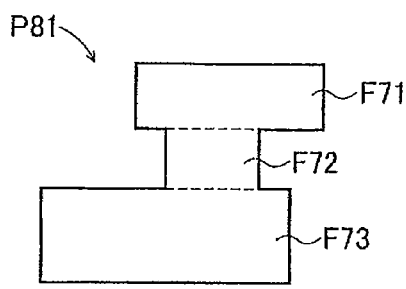
FIGS. 27A and 27B illustrate resize processing according to comparative examples.

FIG. 27A illustrates a pattern P81 in which the positions of the figures F71 and F72 are shifted rightward as compared with those in FIG. 26A and the right side of the figure F71 is located beyond the right side of the figure F73. Increasing the size of the pattern P81 to resize the pattern P81 will now be described.

Figure 27B:
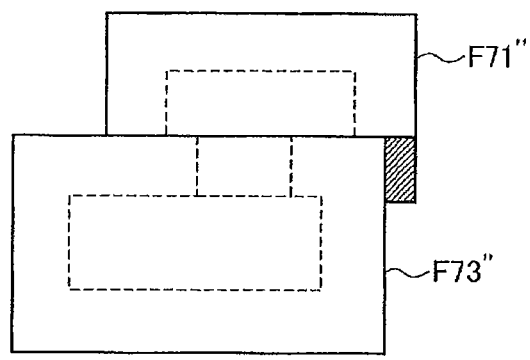

The pattern P81 is divided into the three rectangular figures F71, F72, and F73. Assuming that the amount of resizing is L, the amount of resizing of the figure F71" in the downward direction is 0 in a manner similar to FIG. 26D, as illustrated in FIG. 27B. In this resizing, however, resizing information about a hatched portion in FIG. 27B cannot be added.

Figure 28A:
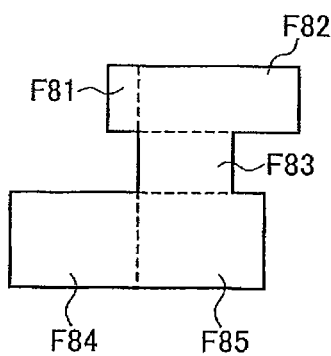
FIGS. 28A and 28B illustrate examples of resize processing.

In the case where the rectangular figures F71 and F73 are misaligned relative to each other such that the right side of the figure F71 is located beyond the right side of the figure F73 and the left side of the figure F71 is located inside the left side of the figure F73, a division line extending vertically may be drawn in the pattern P81 so that the pattern P81 is divided into figures F81 to F85 as illustrated in FIG. 28A.

The left side of the figure F84 is located beyond the left side of the figure F81. The bottom side of a figure F81' is accordingly resized such that part of the figure F81' resized by an amount exceeding the threshold is reversed upward.

The right side of the figure F82 is located beyond the right side of the figure F85. The top side of a figure F85' is accordingly resized such that part of the figure F85' resized by an amount exceeding the threshold is reversed downward.

Figure 28B:
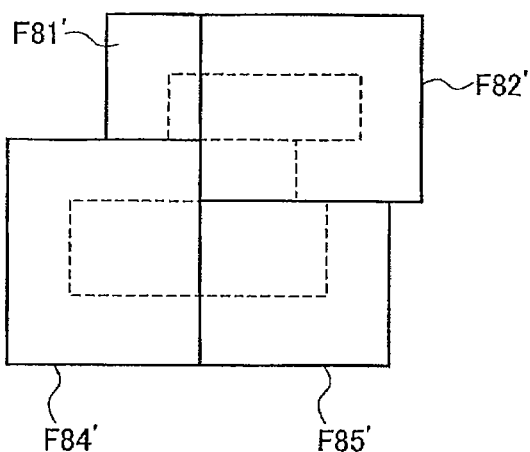

Consequently, as illustrated in FIG. 28B, proper resizing information can be added to each of the figures formed by division. Adding the proper resizing information to write data enables the writing apparatus to perform accurate resizing.

In the above-described first embodiment, the vertices of a write pattern are connected by vectors, collinear vectors pointing in opposite directions are extracted, and the write pattern is divided by a line passing through one of opposed ends of the extracted vectors and extending in a direction orthogonal to the vectors. If a blank that is not included in the pattern is located between the extracted vectors, namely, if another vector exists between two adjacent ends of the two extracted vectors, a line passing through one of the ends of the vectors does not have to be used for division. Such a line may be used for division if there is no vector between the two extracted vectors.

Figure 29A:
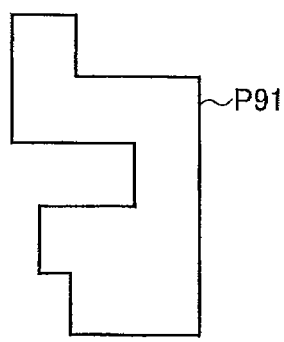
FIGS. 29A and 29B illustrate examples of a pattern to be written.
Figure 29B:
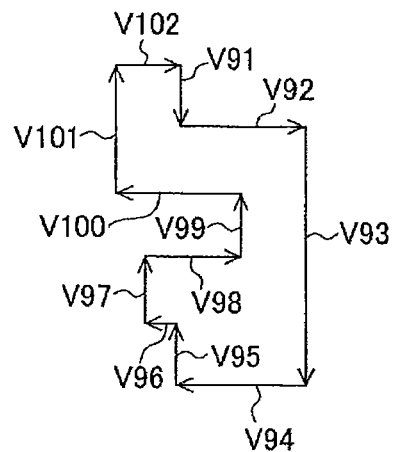

For example, resizing a pattern P91 illustrated in FIG. 29A will be described. The outline of the pattern P91 is surrounded by vectors V91 to V102 as illustrated in FIG. 29B. The vectors V91 and V95 are extracted as collinear vectors pointing in opposite directions. The vectors V98 and V100, however, are located between the vectors V91 and V95 and a blank that is not included in the pattern also exists between the vectors V91 and V95. In this case, if a line passing through the terminal point of the vector V91 or V95 is not used for division, the pattern will be divided into figures such that a side including the vector V91 does not overlap a side including the vector V95.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of generating write data for resizing a write pattern and writing with an energy beam using the write data, the method comprising:
   connecting vertices of the write pattern with a plurality of vectors;
   extracting a pair of collinear vectors pointing in opposite directions from the vectors;
   dividing the write pattern into a plurality of figures with a line passing between two adjacent ends of the extracted pair of vectors and extending in a direction orthogonal to the pair of vectors;
   generating write data for each of the figures, the write data containing figure data and resizing information, the figure data indicating a shape, a size, and a position of the figure, the resizing information indicating resizing or non-resizing, resizing directions in the resizing, and an amount of resizing in each of the resizing directions; and
   writing a resized write pattern with the energy beam in accordance with the generated write data.

2. The method according to claim 1, wherein the dividing includes dividing the write pattern with a line passing through either one of the two adjacent ends of the extracted pair of vectors and extending in a direction orthogonal to the pair of vectors.

3. The method according to claim 1, further comprising when the write pattern has an oblique side:
   eliminating a triangle having the oblique side from the write pattern,
   wherein the connecting includes connecting vertices of the write pattern from which the triangle is eliminated with a plurality of vectors.

4. The method according to claim 3, wherein the triangle eliminated from the write pattern is a right triangle.

5. The method according to claim 3, wherein the extracting includes extracting a pair of collinear vectors which point in the same direction and at least one of which corresponds to one side of the triangle from the vectors.

6. The method according to claim 1, further comprising when the figures, formed by dividing the write pattern, have a first side, a second side, a third side, and a fourth side, the first to fourth sides are connected at one end to one vertex such that the sides meet at right angles at the vertex, the amounts of resizing of the first and third sides which are collinear are different, and the amounts of resizing of the second and fourth sides which are collinear are different:
   adding first additional figure data about a first additional figure having a dimension of zero in a first direction or a second direction orthogonal to the first direction.

7. The method according to claim 1, further comprising when the figures formed by dividing the write pattern include two rectangles opposed to each other, the resizing directions of the rectangles are directions in which the sizes of the rectangles are increased, and the amounts of resizing of opposed sides of the rectangles exceed a threshold:
   resizing one of the opposed sides which has opposite ends located within opposite ends of the other side such that part of the rectangle having the one side resized by an amount exceeding the threshold is reversed in a direction in which the size is reduced.

8. The method according to claim 1,
   wherein when the write pattern is a triangle having an angle other than an integer multiple of 45°, the dividing includes dividing the write pattern into two right triangles with a perpendicular extending from one vertex to a side opposite to the vertex, and
   wherein the method further includes adding second additional figure data about a second additional figure having a dimension of zero in a first direction or a second direction orthogonal to the first direction such that the second additional figure is added between the two right triangles.

9. The method according to claim 1, wherein no vector exists between the two adjacent ends of the extracted pair of vectors.

10. A method of writing with an energy beam, the method comprising:
    reading write data corresponding one-to-one to figures constituting a write pattern from a storage, the figures being formed such that vertices of the write pattern are connected by a plurality of vectors, a pair of collinear vectors pointing in opposite directions is extracted from the vectors, and the write pattern is divided into the figures by a line passing between two adjacent ends of the extracted pair of vectors and extending in a direction orthogonal to the pair of vectors, the write data each containing figure data and resizing information, the figure data indicating a shape, a size, and a position of the figure, the resizing information indicating resizing or non-resizing, resizing directions in the resizing, and an amount of resizing in each of the resizing directions;
    judging resizing or non-resizing of each of the figures, resizing directions, and amounts of resizing in accordance with the corresponding write data item;
    resizing each of the figures in accordance with judging results; and
    writing the resized figures on a substrate with the energy beam.

11. The method according to claim 10, wherein when the write data indicates that the figures, formed by dividing the write pattern, have a first side, a second side, a third side, and a fourth side, the first to fourth sides are connected at one end to one vertex such that the sides meet at right angles at the vertex, the amounts of resizing of the first and third sides which are collinear are different, and the amounts of resizing of the second and fourth sides which are collinear are different, the resizing includes adding a first figure that is in contact with any of the first side, the second side, the third side, and the fourth side.

12. The method according to claim 10, wherein when the write data indicates that the write pattern is a triangle having an angle other than an integer multiple of 45°, the resizing includes dividing the triangle into two right triangles with a perpendicular extending from one vertex of the triangle to a side opposite to the vertex, and adding a second figure between the two right triangles.

13. An energy beam writing apparatus comprising:
 a storage configured to store write data corresponding one-to-one to figures constituting a write pattern, the figures being formed such that vertices of the write pattern are connected by a plurality of vectors, a pair of collinear vectors pointing in opposite directions is extracted from the vectors, and the write pattern is divided into the figures by a line passing between two adjacent ends of the extracted pair of vectors and extending in a direction orthogonal to the pair of vectors, the write data each containing figure data and resizing information, the figure data indicating a shape, a size, and a position of the figure, the resizing information indicating resizing or non-resizing of the figure, resizing directions in the resizing, and an amount of resizing in each of the resizing directions;
 a judging processing circuitry configured to judge resizing or non-resizing of each of the figures, resizing directions, and amounts of resizing in accordance with the corresponding write data item;
 a resize processing circuitry configured to resize each of the figures in accordance with judging results; and
 a writing mechanism, including an energy source, a deflector and a stage on which a substrate is placed, writing the resized figures on the substrate with an energy beam.

14. The apparatus according to claim 13, wherein when the write data indicates that the figures, formed by dividing the write pattern, have a first side, a second side, a third side, and a fourth side, the first to fourth sides are connected at one end to one vertex such that the sides meet at right angles at the vertex, the amounts of resizing of the first and third sides which are collinear are different, and the amounts of resizing of the second and fourth sides which are collinear are different, the resize processing circuitry adds a first figure that is in contact with any of the first side, the second side, the third side, and the fourth side.

15. The apparatus according to claim 13, wherein when the write data indicates that the write pattern is a triangle having an angle other than an integer multiple of 45°, the resize processing circuitry divides the triangle into two right triangles with a perpendicular extending from one vertex of the triangle to a side opposite to the vertex and adds a second figure between the two right triangles.

* * * * *